United States Patent [19]

Redfield

[11] Patent Number: 4,570,085

[45] Date of Patent: Feb. 11, 1986

[54] SELF BOOTING LOGICAL AND CIRCUIT

[75] Inventor: James W. Redfield, Pottstown

[73] Assignee: Commodore Business Machines Inc., West Chester, Pa.

[21] Appl. No.: 458,435

[22] Filed: Jan. 17, 1983

[51] Int. Cl.[4] .......................................... H03K 19/096
[52] U.S. Cl. .................................... 307/453; 307/269; 307/443; 307/482; 307/578
[58] Field of Search ............... 307/443, 445, 448, 453, 307/480–482, 577–578, 583, 269

[56] References Cited

U.S. PATENT DOCUMENTS

| | | | |
|---|---|---|---|
| 3,518,451 | 6/1970 | Booher | 307/443 |
| 3,573,487 | 4/1971 | Polkinghorn | 307/453 |
| 3,651,334 | 3/1972 | Thompson et al. | 307/279 X |
| 3,935,474 | 1/1976 | Komarek | 307/453 X |
| 4,044,270 | 8/1977 | Lesser | 307/481 |
| 4,316,106 | 2/1982 | Young et al. | 307/443 X |

Primary Examiner—Stanley D. Miller
Assistant Examiner—D. Hudspeth
Attorney, Agent, or Firm—John J. Simkanich

[57] ABSTRACT

A solid state logical "AND" circuit implementation in NMOS circuitry has clock pulse conditioning providing self booting voltage levels for ultra fast propagation times and minimal power dissipation, where memory row driver concepts are utilized and silicon area is minimized, and two, low impedance, non-overlapping clock pulses, normally present in the environment are utilized.

6 Claims, 2 Drawing Figures

SELF BOOTING LOGICAL "AND" CIRCUIT

FIG. 1. SELF BOOTING LOGICAL "AND" CIRCUIT
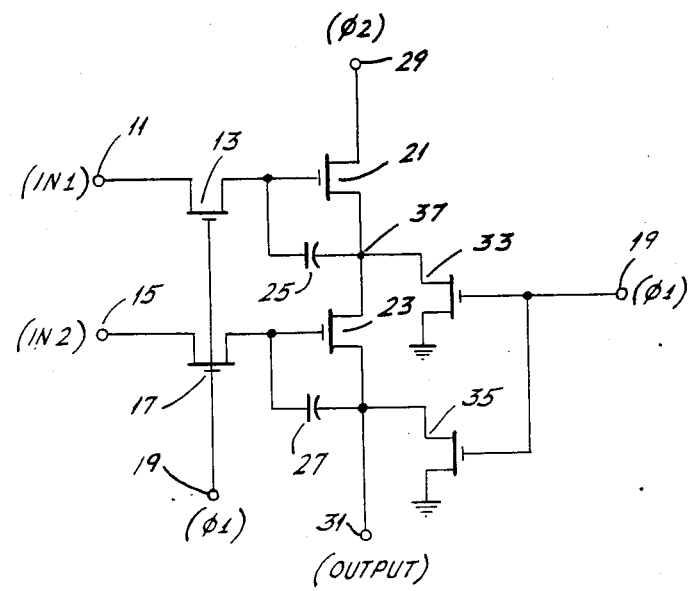
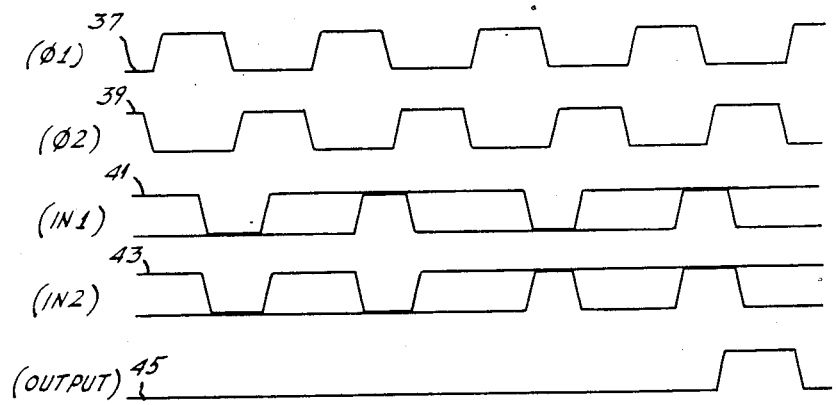
FIG. 2.

SELF BOOTING LOGICAL AND CIRCUIT

BACKGROUND OF THE INVENTION

This invention relates to solid state circuits having a specific dedication to certain aspects i.e. functions in digital logic circuitry. Specifically it relates to circuits for performing logical "AND" functions, and especially such logical "AND" functions which are implemented within large scale integrated circuits (LSI).

Certain design methodologies or parameters have in the past dominated circuit design. One of these was that high speed circuits generally required more power and therefore took up more silicon area to implement. High speed circuits are desirable in any application. However, with the advent of mini-computers, micro-processors and LSI circuitry, it has become increasingly desirable to increase circuit speed (i.e. minimize propagation or delay times) while minimizing power consumption and size (i.e. silicon area needed to implement a circuit).

Arithmetic decision making circuitry for performing logic functions used in computing hardware are most always operated with clock pulses. Such clock pulses assure synchronous operation, minimize data (bit information) loss and minimize errors.

An object to the present invention is to utilize the existence of low impedance, non-overlapping clock pulses in logic function operation.

A second object of this invention is to provide such a logic function operation in a circuit which may be operated at much higher speeds than is normally possible using conventional design methodologies.

A further object of this invention is to provide such a logic circuit which utilizes such clock pulse signals to precondition the circuit enabling a fast rise or trigger, i.e. high speed propagation, the application of such preconditioning causing a "self booting" effect on the circuit.

SUMMARY OF THE INVENTION

The objects of this invention are realized in a large scale integrated circuit (LSI) implementation of NMOS technology, where silicon devices connected in series implement a logical "AND" function. A first timing clock pulse is used to condition the "AND" function silicon devices by building a charge thereon prior to the logical operation thereby enabling a minimization of the current drain by the circuit when the circuit is operated. The first timing clock pulse is preferably, naturally occurring in the circuit environment.

A second, non-overlapping clock pulse, also normally occurring in the circuit environment, is then used to clock the logical operation of the "AND" circuit.

Isolation silicon devices are utilized, one each, to isolate both inputs of the "AND" circuit during the conditioning phase, while a charge is allowed to build up on the series connected silicon devices forming the operative "AND" logical function. Depletion devices are connected across these series connected logical function to provide a more effective boot when the circuit is clocked, and to provide noise immunity when the circuit output is to remain at a low voltage level.

A pair of silicon devices may be respectively one each connected between each of the series connected devices for shunting these devices outputs to ground to assure faster "roll-off" or "fall-off" of the output signal.

DESCRIPTION OF THE DRAWINGS

The advantages, features and operation of this invention will be readily understood from a reading of the following detailed description in conjunction with the accompanying drawings in which like numerals refer to like elements and in which:

FIG. 1 is a diagram of the circuit of the logial "AND" device; and

FIG. 2 is a timing diagram for the operation of the circuit of FIG. 1.

DETAILED DESCRIPTION OF THE INVENTION

A logic "AND" function is implemented in a large scale integrated circuit (LSI) in NMOS type technology, having a first circuit input (IN1) node 11, FIG. 1, connected to the drain pin of a first field effect transistor (FET) 13. The second circuit input (IN2) node 15 is connected to the drain pin of a second FET 17. The gate pins of each of the first and second FETs 13,17 are tied together and to a first clock pulse $\Phi1$ appearing on circuit node 19. These first clock pulses 19 are normally occurring in the environment in which the invention operates.

The source pin of the first FET 13 is connected to the gate pin of a third FET 21, while the source pin of the second FET is connected to the gate pin of a fourth FET 23. A first capacitor 25 is connected between the gate pin and the source pin of the third FET 21, while a second capacitor 27 is connected between the gate pin and the source pin of the fourth FET 23.

The drain pin of the third FET 21 is connected to a second clock pulse ($\Phi2$) at the circuit node 29. As with the first clock pulse 19, this second clock pulse 29 is normally occurring in the environment of the circuit and is a low impedance, non-overlapping train of clock pulses as with the first clock pulses 19. The source then of the third FET 21 is connected to the drain pin of the fourth FET 23, while the source pin of the fourth FET 23 is connected to the circuit output, circuit node 31.

A fifth FET 33 is connected across the source pin of the third FET 21 and ground, with its drain pin connected to the source pin of the third FET 21 and with the source pin connected to ground. A sixth FET 35 is connected between the source pin of the fourth FET and ground with its drain pin connected to the source pin of the fourth FET 23 and its source pin connected to circuit ground. The first clock pulses which are available on the circuit node 19 are also connected to the gate pins of each of the fifth and sixth FETs.

The timing diagram for the clock operation of the self booting logical "AND" circuit is seen as FIG. 2. Here line 37 represents the first clock pulses appearing at circuit node 19, while line 39 represents the non-overlapping clock pulses, the second clock pulses appearing at circuit node 29. It is readily recognized that the second clock pulse($\Phi2$)(line 39) is the inverse of the first clock pulse($\Phi1$)(line 37).

Line 41 represents the first input signal appearing on circuit node 11, while line 43 represents the second input signal appearing on circuit node 15. Line 45 represents the circuit output which appears at node 31.

The circuit operates as follows. During a first time period while the first clock pulse ($\Phi1$) appearing on circuit node 19 is high and the second clock pulse ($\Phi2$) appearing on circuit node is low, the first and second FETs 13,17 respectively, conduct allowing whatever signal that is appearing on the first and second input nodes 11,15, respectively, to build onto the gate pin of each of the third and fourth FETs 21,23. This provides a preconditioning of the gate pins of these FETs 21,23 which allows for a self-booting effect.

In a second phase of the circuit operation, the first clock pulse ($\Phi$1) at node 19 goes "low" isolating the input nodes 11,15, while the second clock pulse ($\Phi$2) appearing at circuit node 29 goes "high", which enables a propagation of the output at node 31. If a "high" had been stored on both the gate pins of FETs 21 and 23 the output is "high". Otherwise the output 31 remains "low".

The capacitors 25 and 27 normally implemented with depletion transistors are included to help minimize charge redistribution onto the parasitic capacitive source region of the first two FETs 13 and 17 thus providing a higher boot voltage on the gates of FETs 21 and 23. They also provide noise immunity when either FET 21 or 23 has been preconditioned to a low voltage level by "soaking up" charge which is pumped onto the gates of FET's 21 and 23 due to gate overlap to the drain region of the $\Phi$2 clock input node 29 (with respect to device 21) or the internal node 35 (with respect to device 23). These capacitors enable the circuit to operate more efficiently, but are not necessary and may be left out.

This operation allows for a very fast response time, the output on node 31 appearing in a time of 3 to 8 nano seconds behind the rise of the second clock pulse ($\Phi$2) on node 19. Since there is no static path to ground (assuming non-overlapping clocks), the circuit draws no DC current thereby reducing the effective power consumption of the circuit during operation to that AC power necessary to charge and discharge the output node 31.

The fifth and sixth FET 33,35 are operated as shunt switches to dissipate any residual charge on the output of the respective FET 21,23 and therefore the output node 31 of the circuit upon a rising edge of the first clock pulse ($\Phi$1) at node 19. This enables a fast fall-off of the output signal to a low and a fast latching of the circuit to the low voltage level. Where silicon area is at an extreme premium, and the operation of the circuit is not so critical that a slower roll-off or slower fall-off time is acceptable for the output pulse, the fifth and sixth FETs 33,35 can be eliminated from the circuit.

The above description of the invention is intended to be illustrative and is not to be taken in the limiting sense. Many changes can be made without departing from the intent or the scope thereof. As an example, inverters can be incorporated into the circuit at the input node 11, 15. This would invert the input signals appearing at these nodes and transforms the "AND" function of the circuit to a "NOR" function.

What is claimed is:

1. A digital logic AND circuit having a first input node, a second input node and an output node for performing logical "AND" functions in an environment where a first and a second non-overlapping clock pulses are present, comprising:

a first and second gate operated switching means each for passing a signal when enabled, said second switching means being connected in series with said first switching means so as to pass a signal when both said first and second switching means are enabled;

a third gate operated switching means, having a connection to receive said first clock pulses, being connected between said first input node and said first switching means, for selectively connecting said first input node to said first gate operated switching means to gate said first switching means to pass said signal only in the presence of said first clock pulses; and a fourth gate operated switching means having a connection to receive said first clock pulses, being connected between the second input node and said second switching means, for selectively connecting said second input node to said second gate operated switching means to gate said second switching means to pass said signal only in the presence of said first clock pulses;

wherein said first switching means is connected to receive said second clock pulses, said second clock pulses constituting said passed signal, and wherein said second switching means is connected to pass said signal to said output node.

2. The AND circuit of claim 1 also including a fifth gate operated switching means being connected between said first switching means and ground, and a sixth gate operated switching means being connected between said second switching means and ground, said fifth and sixth switching means each having a connection to receive said first clock pulse and being selectively operable for providing a ground shunt when receiving said first clock pulses.

3. The AND circuit of claim 2 wherein said first switching means comprises a first FET having a connection to receive said second clock pulses, said second switching means comprises a second FET connected to said first FET, said third switching means comprises a third FET being connected between said first input node and said first FET gate electrode, said fourth switching means comprises a fourth FET connected between said second input node and said second FET gate electrode, and also comprising a first capacitor connected between said first FET gate electrode and source electrode and a second capacitor connected between said second FET gate electrode and source electrode.

4. The AND circuit of claim 3 wherein said fifth switching means comprises a fifth FET connected on its drain electrode to said first FET source electrode and on its source electrode to ground, and said sixth switching means comprises a sixth FET connected on its drain electrode to said second FET source electrode and on its source electrode to ground.

5. The AND circuit of claim 4 wherein the drain electrode of said third FET is connected to said first input node, and its gate electrode is connected to receive said first clock pulses and its source electrode is connected to the gate of said first FET, wherein the drain electrode of said fourth FET is connected to said second input node, and its gate electrode is connected to receive said first clock pulses and its source electrode is connected to the gate electrode of said second FET.

6. A self booting logical AND circuit having a first input node a second input node and an output node and operating responsive to a first clock pulse and to a second clock pulse, said first and second clock pulses being non-overlapping with said first clock pulse appearing first, comprising:

a first gate operated switch means having a connection to receive said second clock pulse and being selectively switchable to pass said second clock pulse when conditioned by a signal on its gate;

a second gate operated switch means connected in series to said first switch means output, the output of said second switch means being connected to said output node, said second gate operated switch means being selectively switchable to pass said second clock pulse received from said first switch means when said second switch means is conditioned by a signal on its gate;

first gate operated selective connection means having a connection on its gate to receive said first clock pulse and being connected between said first input node and said first switch means gate to connect said first input node to said first switch means gate when said first clock pulse is received on its gate; and second gate operated selective connection means having a connection on its gate to receive said first clock pulse and being connected between said second input node and said second switch means gate to connect said second input node to said second switch means gate when said first clock pulse is received on its gate.

* * * * *

UNITED STATES PATENT AND TRADEMARK OFFICE
CERTIFICATE OF CORRECTION

PATENT NO. : 4,570,085
DATED : Feb. 11, 1986
INVENTOR(S) : James W. Redfield

It is certified that error appears in the above-identified patent and that said Letters Patent is hereby corrected as shown below:

Col 4 line 62: after "input node", first occurence insert - -, (comma) - -.

Signed and Sealed this

Twenty-ninth Day of July 1986

[SEAL]

Attest:

Attesting Officer

DONALD J. QUIGG

Commissioner of Patents and Trademarks